US010670437B2

(12) United States Patent
Brockhaus et al.

(10) Patent No.: US 10,670,437 B2
(45) Date of Patent: Jun. 2, 2020

(54) MAGNETIC-INDUCTIVE FLOWMETER AND METHOD FOR OPERATING A MAGNETIC-INDUCTIVE FLOWMETER

(71) Applicant: KROHNE Messtechnik GmbH, Duisburg (DE)

(72) Inventors: Helmut Brockhaus, Oberhausen (DE); Wilhelm Florin, Duisburg (DE)

(73) Assignee: KROHNE MESSTECHNIK GMBH, Duisburg (DE)

( * ) Notice: Subject to any disclaimer, the term of this patent is extended or adjusted under 35 U.S.C. 154(b) by 241 days.

(21) Appl. No.: 16/004,788

(22) Filed: Jun. 11, 2018

(65) Prior Publication Data

US 2018/0356267 A1 Dec. 13, 2018

(30) Foreign Application Priority Data

Jun. 13, 2017 (DE) .......................... 10 2017 112 950

(51) Int. Cl.
| | | |
|---|---|---|
| *G01F 1/58* | (2006.01) | |
| *G01R 33/07* | (2006.01) | |
| *G01R 33/028* | (2006.01) | |
| *G01F 15/18* | (2006.01) | |
| *G01F 15/02* | (2006.01) | |
| *G01D 21/02* | (2006.01) | |

(Continued)

(52) U.S. Cl.
CPC ............. *G01F 1/588* (2013.01); *G01D 21/02* (2013.01); *G01F 1/58* (2013.01); *G01F 1/86* (2013.01);

(Continued)

(58) Field of Classification Search
CPC . G01F 15/02; G01F 15/18; G01F 1/58; G01F 1/588; G01F 1/86; G01F 23/26;
(Continued)

(56) References Cited

U.S. PATENT DOCUMENTS

| | | | | |
|---|---|---|---|---|
| 4,019,385 A | * | 4/1977 | Watanabe | ................. G01F 1/58 73/861.12 |
| 4,159,645 A | | 7/1979 | Cushing | |

(Continued)

FOREIGN PATENT DOCUMENTS

| | | |
|---|---|---|
| DE | 197 13 751 A1 | 10/1998 |
| DE | 10 2007 024 006 A1 | 11/2008 |

(Continued)

*Primary Examiner* — Francis C Gray
(74) *Attorney, Agent, or Firm* — David S. Safran; Roberts Calderon Safran & Cole, P.C.

(57) ABSTRACT

A magnetic-inductive flowmeter for measuring the flow of a conductive medium having a measuring tube, a magnetic field generator, a magnetic circuit device for guiding the measuring magnetic field, electrodes for detecting a flow-dependent electrical measuring voltage when the conductive medium flows through the measuring tube, and an electronic control and evaluation unit, and a method for operating the magnetic-inductive flowmeter. To make the magnetic-inductive flowmeter which smaller and cheaper, a sensor for detecting a physical disturbance variable acting on the magnetic circuit device is arranged on the magnetic circuit device, wherein the measuring magnetic field is influenced by the physical disturbance variable and wherein the control and evaluation unit is designed such that it detects and signals an exceeding or falling below of a pre-definable limit value of the physical disturbance variable and/or performs a correction of the effect of the physical disturbance variable on the flow measurement.

15 Claims, 7 Drawing Sheets

(51) Int. Cl.
*G01F 1/86* (2006.01)
*G01F 23/26* (2006.01)
*G01F 25/00* (2006.01)
*G01P 15/00* (2006.01)

(52) U.S. Cl.
CPC ............. *G01F 15/02* (2013.01); *G01F 15/18* (2013.01); *G01F 23/26* (2013.01); *G01F 25/0007* (2013.01); *G01R 33/0283* (2013.01); *G01R 33/07* (2013.01); *G01P 15/00* (2013.01)

(58) Field of Classification Search
CPC ...... G01F 25/0007; G01D 21/02; G01P 15/00; G01R 33/0283; G01R 33/07
See application file for complete search history.

(56) References Cited

U.S. PATENT DOCUMENTS

| | | | |
|---|---|---|---|
| 4,236,410 A | 12/1980 | Appel et al. | |
| 5,551,306 A | 9/1996 | Scarpa | |
| 6,092,428 A * | 7/2000 | Brockhaus | G01F 1/002 73/861.14 |
| 10,024,707 B2 | 7/2018 | Tham | |
| 2003/0005777 A1* | 1/2003 | Budmiger | G01F 1/588 73/861.12 |
| 2008/0012428 A1* | 1/2008 | Lalla | G01D 21/00 307/97 |
| 2014/0083199 A1* | 3/2014 | Rogers | G01F 1/584 73/861.12 |
| 2015/0097560 A1* | 4/2015 | Kawakami | G01R 33/09 324/252 |
| 2017/0097251 A1 | 4/2017 | Dabrowski et al. | |

FOREIGN PATENT DOCUMENTS

| | | | |
|---|---|---|---|
| JP | 2004219372 A | * | 8/2004 |
| JP | 2006118938 A | * | 5/2006 |
| JP | 2007-71798 A | | 3/2007 |

* cited by examiner

MAGNETIC-INDUCTIVE FLOWMETER AND METHOD FOR OPERATING A MAGNETIC-INDUCTIVE FLOWMETER

BACKGROUND OF THE INVENTION

Field of the Invention

The invention relates to a magnetic-inductive flowmeter for measuring the flow of a conductive medium, with a measuring tube, with a magnetic field generator for generating a measuring magnetic field passing through the measuring tube, with a magnetic circuit device for guiding the measuring magnetic field outside the measuring tube, with electrodes for detecting a flow-dependent electrical measuring voltage when the conductive medium flows through the measuring tube and with an electronic control and evaluation unit. The invention further relates to a method for operating a magnetic-inductive flowmeter.

Description of Related Art

Generic magnetic-inductive flowmeters are known from the prior art and are used to determine the flow of a medium. For this, the magnetic field generator generates a magnetic field which at least partially passes through the electrically conductive medium located in the measuring tube. Due to the flow of the medium in the measuring tube, an induction voltage is induced in the medium by charge separation, which is tapped by the electrodes. The measurement voltage then results from the induction voltage actually induced due to the charge separation in the medium and from interference voltages resulting, for example, from a time-varying magnetic flux in the conductor loop formed by the electrodes, the electrode cables and the electrically conductive medium. The measuring voltage is proportional to the speed of flow of the medium in the measuring tube. With the speed of flow of the medium and the diameter of the measuring tube, the flow rate—volume flow or mass flow at known density—of the medium can then be determined. Generic magnetic-inductive flowmeters also have a magnetic circuit device in addition to the magnetic field generator. This magnetic circuit device is used for guiding the measuring magnetic field outside the measuring tube and for concentrating the measuring magnetic field to the region of the measuring tube and is usually made of a magnetically soft material.

Since the flow of the medium through the measuring tube is determined from the measuring voltage and the measuring voltage is proportional to the speed of flow of the medium in the measuring tube and the measuring magnetic field strength in the medium, it is crucial to generate the field strength of the magnetic field inside the measuring tube with high repeatability, namely over the lifespan of the measuring device. High initial accuracy is usually achieved by calibrating the meters with "wet" flow. Among other things, to ensure a high degree of repeatability, care must be taken to ensure that the magnetic field in the application no longer changes and other disturbing influences are suppressed. Known disturbing influences are electrochemical interference voltages, mains interference voltages and induction voltages in the conductor loop of the measuring circuit. For the suppression of interference, it is known from the prior art to carry out magnetic-inductive flow measurements with a switched constant magnetic field or an alternating magnetic field. The measurement of the measurement voltage induced at the electrodes takes place here in phase synchronization with the field changeover.

However, influencing the flow measurement is not only due to direct influences, such as the superimposed external magnetic field, but also by indirect influences. Indirect influences are those influences that change the properties of the magnetic circuit device. A change in the properties of the magnetic circuit device inevitably results in a change in the measuring magnetic field and thus a change in the measuring voltage. Indirect influences here are, in particular, a saturation of the magnetic circuit device due to external magnetic fields acting on the magnetic circuit device, a change in the permeability of the magnetic circuit device due to the influence or a change in the temperature of the magnetic circuit device and mechanical changes of the magnetic circuit device, for example due to vibrations.

From the prior art, it is known to prevent saturation of the magnetic circuit device by oversizing it and by magnetic shielding. The effect of temperature is countered in the prior art by the use of high quality materials that have only a small dependence of the permeability on temperature. Problems associated with the known solutions are, on the one hand, the extremely high production costs due to the use of high-quality materials and, on the other hand, heavy and large-scale flowmeters resulting from the oversizing of the magnetic circuit device.

SUMMARY OF THE INVENTION

Thus, the object of the invention is to provide a magnetic-inductive flowmeter, which has a smaller and cheaper construction than magnetic-inductive flowmeters known from the prior art. It is also the object of the invention to specify a method for operating such a magnetic-inductive flowmeter.

The above objects are achieved in the magnetic-inductive flowmeter according to the invention, initially and essentially, in that a sensor for detecting a force acting on the magnetic circuit device is arranged on the magnetic circuit device, wherein the measuring magnetic field is influenced by this physical disturbance variable. The control and evaluation unit of the magnetic-inductive flowmeter according to the invention is designed such that it detects and signals the exceeding of a pre-definable limit value of the physical disturbance variable and/or performs a correction of the effect of the physical disturbance variable on the flow measurement. The magnetic-inductive flowmeter according to the invention is thus initially characterized by a sensor on the magnetic circuit device with which the physical disturbance variable acting on the magnetic circuit device can be detected, preferably both in terms of its type and in terms of its size. The detection of the physical disturbance variable makes it possible to detect and correct the effect of the disturbance on the flow measurement. The sensor for detecting the physical disturbance variable may be indirectly or directly connected to the magnetic circuit device.

The sensor is preferably arranged from the outside on the magnetic circuit device. That means that the sensor is arranged on the side of the magnetic circuit device that faces away from the measuring tube on the outer surface of the magnetic circuit device so that the sensor is outside of the magnetic circuit.

In one design, a limit value for the physical disturbance variable is specified. This limit value can be stored, for example, in the control and evaluation unit. The limit value describes that value of the physical disturbance variable at which the effects of the disturbance on the flow measurement are so large that the measurement should be discarded or, in any case, it should be signaled that the reliability of the obtained measured value is doubtful. Flow measurement should be discarded, or becomes unusable in this context, if the flow measurement is so distorted due to the effect of the physical disturbance variable on the flow measurement that a tolerable deviation from the actual flow value is exceeded. This limit value can be determined by a user, for example. If the sensor detects a value of the physical disturbance variable that exceeds the predetermined limit value, an exceeding of the limit value is detected and signaled by the control and evaluation unit. The user then knows that the result of the flow measurement does not allow a reliable statement about the actual flow and can reject the measurement. Falling below a predetermined limit can also be signaled. It is therefore possible to specify an upper limit for the physical disturbance variable or a lower limit for the physical disturbance variable. It is also possible to specify both an upper and a lower limit for the physical disturbance variable. If both an upper and a lower limit value are specified, an exceeding of the upper limit value as well as a falling below of the lower limit value is detected and signaled.

The control and evaluation unit may alternatively or additionally be designed such that it performs a correction of the effect of the physical disturbance variable on the flow measurement. Exactly what such a correction of the effect of the physical disturbance variable may look like is described in conjunction with the method according to the invention for operating the magnetic-inductive flowmeter. Overall, the control and evaluation unit can be designed such that it detects and signals both exceeding or falling below a pre-definable limit value of the physical disturbance variable and performs a correction of the effect of the physical disturbance variable on the flow measurement, or that it recognizes only an exceeding or a falling below of a predetermined limit value of the physical disturbance variable, or it can also be configured such that it only performs a correction of the effects of the physical disturbance variable on the flow measurement. The correction of the effects of the disturbance on the flow measurement can therefore be carried out regardless of whether a limit value is predetermined or not.

The magnetic-inductive flowmeter according to the invention thus differs from the magnetic-inductive flowmeters known from the prior art in that the effects of the physical disturbance variable are not compensated directly due to the design of the magnetic-inductive flowmeter, but that the physical disturbance variable initially occurs at all is determined. Flow measurement, thus, takes place in the magnetic-inductive flowmeter according to the invention while still under the influence of the physical disturbance variable. If the physical disturbance variable is too large, or if the effects of the physical disturbance variable on the flow measurement are too blatant, flow measurement can be discarded by a user insofar as the control and evaluation unit detects and signals exceeding or falling below a limit value of the physical disturbance variable.

It is also conceivable in the magnetic-inductive flowmeter according to the invention that the effect of the physical disturbance variable on the flow measurement is corrected. Therefore, the disturbance on flow measurement is not constructively prevented according to the invention, but the effects of the disturbance are corrected in hindsight, when determining the flow. The magnetic-inductive flowmeter according to the invention thus has the advantage that no new, in particular very elaborate, expensive or oversized construction of the magnetic-inductive flowmeter, in particular the magnetic circuit device is necessary. Rather, the magnetic-inductive flowmeter according to the invention can have a small design and also be manufactured inexpensively. It is also possible to upgrade already existing magnetic-inductive flowmeters to the magnetic-inductive flowmeter according to the invention by arranging a sensor for detecting physical disturbance variables acting on the magnetic circuit device on the magnetic circuit device.

A preferred design of the magnetic-inductive flowmeter according to the invention is wherein the sensor is designed as a temperature sensor and is used to detect the temperature of the magnetic circuit device. A change in the temperature of the magnetic circuit device leads to a change in the permeability of the magnetic circuit device, i.e., to a change in the permeability of the magnetic field device for magnetic fields. A changed permeability thus results in a changed measuring magnetic field. A change in the temperature of the magnetic circuit device may be caused, for example, by a change in the medium temperature. Changing the medium temperature also changes the temperature of the measuring tube, through which the medium flows. Since the measuring tube and the magnetic circuit device are in contact with one another—in particular in thermal contact—, a change in the medium temperature also has an effect on the temperature of the magnetic circuit device. Also, the ambient temperature of the magnetic-inductive flowmeter may change. This change has an immediate effect on the temperature of the magnetic circuit device. The temperature sensor according to the invention is directly or indirectly connected to the magnetic circuit device.

In one design, a limit value for the temperature of the magnetic circuit device is predetermined. The limit value describes the temperature value at which the effects of the temperature changes on the flow measurement are so great that the measurement has become unusable or is so inaccurate that is no longer tolerable. If the temperature sensor detects a temperature value that exceeds the predetermined limit value, i.e., if the magnetic circuit device has a temperature above a maximum tolerable temperature, an exceeding of the limit value is detected and signaled by the control and evaluation unit. A falling below of a predetermined limit value is also signaled. Also, cooling the magnetic circuit device to a temperature below a tolerable magnetic circuit temperature falsifies flow measurement, since cooling as well as heating is accompanied by a change in the permeability of the magnetic circuit device and thus a change in the measuring magnetic field.

Alternatively, or additionally, it is also possible that a correction of the effect of the temperature of the magnetic circuit device is carried out on the flow measurement. In connection with the correction of the effect of the temperature, reference is also made to the statements in connection with the method according to the invention. If the control and evaluation unit is designed such that it recognizes and signals both exceeding or falling below of a predetermined temperature value and corrects the effects of the temperature on the flow measurement, a correction of the effect of the temperature is preferably carried out if the limit values are not yet exceeded or fallen below.

A particularly preferred design of the magnetic-inductive flowmeter according to the invention is wherein the sensor is designed as a magnetic field sensor and is used to detect an external magnetic field acting on the magnetic circuit device. Particularly preferably, the magnetic field sensor is configured here as a Hall sensor. The use of a Hall sensor is particularly preferred because such a sensor has a directional dependence. A Hall sensor is thus only sensitive to a magnetic field in a particular spatial direction, or to a component of a magnetic field along a spatial direction. An external magnetic field acting on the magnetic circuit device may have the influence that saturation of the magnetic circuit device in the direction of the external magnetic field occurs. However, an influence of an external magnetic field is not only disturbing when it comes to saturation of the magnetic circuit device, but also when it comes to "any" alignment of the magnetic moments of the magnetic circuit device in the external magnetic field. Aligning the magnetic moments of the magnetic circuit device in the external magnetic field inevitably leads to an influence of the measuring magnetic field and thus to an influence or disturbance of the flow measurement. The effects of the external magnetic field on the flow measurement are not only dependent on the strength of the external magnetic field, but also on the direction of the external magnetic field.

In a preferred design, the control and evaluation unit is configured such that it performs a correction of the effects of the external magnetic field on the flow measurement. Also in connection with the correction of the effects of the external magnetic field, reference is made to the statements in connection with the method according to the invention. If the control and evaluation unit is designed in such a manner that it detects and signals that a pre-definable limit value of the external magnetic field has been exceeded, or if the control and evaluation unit is designed such that it detects and signals only an exceeding of a limit value, then a particularly preferred embodiment of the magnetic-inductive flowmeter according to the invention presents itself in that the sensor is designed as a magnetic switch and is used to detect the external magnetic field acting on the magnetic field device. When using a magnetic field sensor or a magnetic field switch, only an upper limit value is preferably determined, since in the ideal case no external magnetic field acts on the magnetic circuit device, a lower limit value therefore has no use. The exceeding of a predetermined limit value can be signaled in that a defined error state is taken.

A particularly preferred embodiment of the magnetic-inductive flowmeter according to the invention is wherein the sensor is designed as an acceleration sensor. The sensor is used to detect an acceleration of the magnetic circuit device. This acceleration is caused in particular by vibrations. These vibrations are generated and fed, for example, by a pump connected to the magnetic-inductive flowmeter. However, the vibrations can also be transmitted by other components. Vibrations acting on the electromagnetic flowmeter or, generally speaking, accelerations acting on the electromagnetic flowmeter may have various influences that may adversely affect flow measurement.

On the one hand, the vibrations can be transmitted directly to the magnetic circuit device, which leads to a mechanical movement of the magnetic circuit device. Depending on the magnitude of the vibrations, i.e., depending on the magnitude of the amplitude of the vibrations, this can lead to a shift of the magnetic circuit device relative to the measuring tube. If this occurs, then the validity of a previously performed calibration of the flowmeter is questionable, the accuracy of the flow measurements must therefore also be questioned.

On the other hand, mechanical vibrations can be transmitted to the cable leading to the electrodes. The cables are usually coaxial cables. The capacitance in the cable changes due to mechanical vibrations and the resulting deformation of the cables (microphonic effect). This leads to a change in the electrical measurement voltage, which is tapped from the electrodes, or to a change in the measured signal. In preferred magnetic-inductive flowmeters, the measuring frequency is between 20 and 60 Hz. In particular, vibrations originating from pumps are often of the order of magnitude up to 100 Hz, thus falling directly into the range of the measuring frequency.

Likewise, a disturbing induction voltage can be induced by a movement of the cables leading to the electrodes when the conductor loop formed by the cables is permeated by an external magnetic field (or also by the measuring magnetic field). This disturbing induction voltage then forms part of the measurement voltage. By arranging an acceleration sensor and thus enabling detection of the acceleration of the magnetic circuit device, the vibrations—indirectly also of neighboring components—can be detected so that a correction of the effect of the vibration on the flow measurement is made possible.

In one design, the control and evaluation unit is configured such that it detects and signals the exceeding of a predetermined limit value for the vibrations—i.e., in particular exceeding of a predetermined amplitude of the vibrations. If the sensor, as in the embodiment of the magnetic-inductive flowmeter described here, is designed as an acceleration sensor, then preferably only an upper limit value is predetermined, since preferably no vibrations can be measured at the magnetic circuit device, i.e., a lower limit value is of no use. The limit value is the value at which the mechanical stability of the magnetic-inductive flowmeter is barely guaranteed, so that there is no displacement of the magnetic circuit relative to the measuring tube. If this limit is exceeded, it is no longer possible to correct the effect of the vibrations on the flow measurement since the system as a whole is no longer calibrated. However, if a value, in particular a value for the amplitude of the acceleration or the vibrations is detected, that is below the predetermined limit, then a correction of the effect of the acceleration on the flow measurement can be performed. To specify the correction, reference is also made in this context to the following descriptions in conjunction with the method according to the invention.

A further design of the magnetic-inductive flowmeter is wherein at least one further sensor is arranged on the magnetic circuit device. This further sensor is designed in particular as a temperature sensor, as a magnetic field sensor, as a magnetic field switch or as an acceleration sensor. Furthermore, the further sensor arranged on the magnetic circuit device is preferably used to detect a physical disturbance variable acting on the magnetic circuit device, which differs from the disturbance detected by the first sensor. This makes it possible for various influences acting on the magnetic circuit device to be able to be detected. The corrections of the effects of the various physical disturbance variables on the flow measurement can then be carried out separately. It is also conceivable to have a design of a magnetic-inductive flowmeter, in which the first sensor is designed as a magnetic field sensor and the at least one further sensor is likewise designed as a magnetic field sensor. The two magnetic field sensors are then arranged on the magnetic circuit device such that they are sensitive to various components of the external magnetic field. In particular, the first sensor detects a component of the external magnetic field acting in a first direction, and the second magnetic field sensor detects a component of the external magnetic field acting in a second spatial direction different from the first spatial direction.

In a further design of the magnetic-inductive flowmeter, at least three sensors are arranged on the magnetic circuit device, wherein one sensor is configured as a temperature sensor, another sensor as an acceleration sensor and an even further sensor as a magnetic field sensor or magnetic field switch. With this design according to the invention of the magnetic-inductive flowmeter, it is possible to detect three different physical disturbance variables acting on the magnetic circuit device, namely the temperature, the acceleration and an external magnetic field. However, the flowmeter according to the invention is not limited to the arrangement of three sensors on the magnetic circuit device, but rather any number of sensors can be arranged on the magnetic circuit device. A very particularly preferred design of the magnetic-inductive flowmeter is accordingly characterized, for example, in that five sensors are arranged on the magnetic circuit device, namely a temperature sensor, an acceleration sensor and three magnetic field sensors, wherein the respective magnetic field sensors are sensitive in different spatial directions, which are preferably orthogonal to one another are. Thereby, an external magnetic field acting on the magnetic circuit device can be completely detected because its components are detected in each spatial direction.

A particularly preferred design of the magnetic-inductive flowmeter according to the invention is given in that the sensor is attached by means of a sensor attachment element to the magnetic circuit device. If a plurality of sensors is arranged on the magnetic circuit device, then the plurality of sensors can be attached to the magnetic circuit device by means of a sensor attachment element. The plurality of sensors can be attached to the magnetic circuit device as a whole by means of a single sensor attachment element, it is also possible to provide a plurality of sensor attachment elements. In a particularly preferred design, the sensor attachment element is designed as a printed circuit board.

The use of a sensor attachment element results, in particular, in the advantage that simple mounting of the sensors on the magnetic circuit device is possible. The sensors can first be mounted on the sensor attachment element before the sensor attachment element is then brought together with the magnetic circuit device. The type of connection between the magnetic circuit device and sensor attachment element is not relevant here. Preferably, a circuit board is used as a sensor attachment element. A further advantage is that a plurality of sensor attachment elements can be equipped "in advance" with sensors.

A further design of the flowmeter according to the invention is wherein the sensor attachment element is formed as an angle. Particularly preferably, the sensor attachment element is formed as a right angle. This design is particularly advantageous when a plurality of magnetic field sensors is provided. The angle makes it possible to arrange the magnetic field sensors, in particular three magnetic field sensors, in such a way that an external magnetic field acting on the magnetic circuit device can be detected in all three spatial directions.

The invention further relates to a method for operating a magnetic-inductive flowmeter. The magnetic-inductive flowmeter has a measuring tube, a magnetic field generating device for generating a measuring magnetic field passing through the measuring tube, a magnetic circuit device for guiding the measuring magnetic field outside the measuring tube, electrodes for detecting a flow-dependent electrical measuring voltage when the conductive medium flows through the measuring tube and an electronic control and evaluation unit. A sensor for detecting a physical disturbance variable acting on the magnetic circuit device is arranged on the magnetic circuit device, wherein the measuring magnetic field is influenced by the physical disturbance variable.

If it is said that a sensor is arranged on the magnetic circuit device, then this is not a numerically limiting feature. Rather, as described in connection with the magnetic-inductive flowmeter according to the invention, a plurality of sensors can be arranged on the magnetic circuit device.

In the method according to the invention, the physical disturbance variable acting on the magnetic circuit device is first detected with the sensor.

After the physical disturbance variable has been detected, four alternative processes can be carried out according to the method of the invention:

In a first method sequence, the physical disturbance variable is compared to a predetermined limit value and an error state is signaled when the limit value is exceeded or fallen below. If an error state is signaled, then flow measurement is terminated after the signaling of the error state.

In a second method sequence, the physical disturbance variable is compared to a predetermined limit value after its detection. Likewise, if the limit value is exceeded or fallen below, an error state is signaled. If an error state is signaled, then the flow measurement is not terminated, but instead a correction of the effect of the physical disturbance variable on the flow measurement is carried out.

The decision as to whether the flow measurement is terminated after the signaling of the error state or whether a correction of the effect of the physical disturbance variable on the flow measurement is carried out, for example, can be actively made by a user, but it can also be previously determined.

In a third method sequence, the physical disturbance variable is compared to a predetermined limit after its detection. If no error state is signaled, i.e., the limit value is not exceeded or fallen below, then a correction of the effect of the physical disturbance variable on the flow measurement is carried out.

In a fourth method sequence, a correction of the effect of the physical disturbance variable on the flow measurement is carried out directly after the detection of the physical disturbance variable. The method according to the fourth method sequence thus differs from the method according to the third method sequence in that a comparison to a limit value is not carried out. This is the case, for example, if no limit value is stored in the control and evaluation unit.

The method according to the invention is not limited to only one limit value being able to be specified. Rather, for example, an upper limit and a lower limit for the physical disturbance variable can be specified. An error state is then signaled both when the upper limit value is exceeded and when falling below the lower limit value.

In order to be able to carry out a correction of the effect of the physical disturbance variable on the flow measurement, it is provided in one implementation of the method according to the invention that correction data for correcting the magnetic-inductive flow measurement is stored in the control and evaluation unit. This correction data can then be retrieved and used by the control and evaluation unit.

If the sensor is designed as a temperature sensor, then the correction data describes the dependence of the measurement voltage on the temperature of the magnetic circuit device. The dependence of the measuring voltage on the temperature of the magnetic circuit device is caused by the dependence of the measuring magnetic field on the temperature of the magnetic circuit device.

If the sensor is designed as a magnetic field sensor, the correction data describes the dependence of the measuring voltage on the external magnetic field acting on the magnetic field device. The dependence of the measuring voltage on the external magnetic field acting on the magnetic field device is caused by the dependence of the measuring magnetic field from the external magnetic field acting on the magnetic field device. If the sensor is sensitive to a spatial component of the external magnetic field, then the dependence relates to this spatial direction.

The detection of the respective correction data can be carried out, for example, by recording a set of characteristic curves. For this, the electromagnetic flowmeter can be operated with different constant and known flow rates, wherein for each flow, the temperature of the magnetic circuit device is increased or the outer magnetic field acting on the magnetic field device is changed and the measurement voltage is measured. The correction data can be recorded as part of a type test and need not be recorded individually for each type of flowmeter of the same type. Correction data can be interpolated between the interpolation points of the correction characteristic curve or the set of correction characteristic curves. The paths of the characteristic curves or set of characteristic curves for correction can also be mathematically modeled using continuous curve paths (polynomials, splines, etc.).

The correction of the effects of the physical disturbance variable on the flow measurement is carried out in different ways—depending on the type of disturbance variable. If the disturbance is the temperature of the magnetic circuit device or if the disturbance is an external magnetic field acting on the magnetic circuit device, i.e., if the sensor is designed as a temperature sensor or as a magnetic field sensor, then the correction of the effect of the physical disturbance variable is implemented in that, when a conductive medium is flowing through the measuring tube, the detected electrical measurement voltage flows is corrected with the correction data.

If the sensor is designed as an acceleration sensor, the sensor detects the acceleration of the magnetic circuit device, wherein the acceleration is brought about, in particular, by vibrations of the magnetic circuit device, then the correction of the effect of the physical disturbance variable on the flow measurement is implemented, for example, in that the measurement frequency for detecting the electric measuring voltage is selected such that the sampling period corresponds to a multiple of the vibration period. The vibrations of the magnetic circuit device have a vibration frequency and a vibration amplitude detected by the acceleration sensor. The vibration period duration results from the reciprocal of the vibration frequency. Because the sampling period, i.e., the period with which the measured values are recorded, corresponds to a multiple of the vibration period duration—the sampling period can also correspond to the vibration period duration, i.e., the "single" vibration period duration—, beat effects caused by the sampling are suppressed.

The measuring signal itself can also have a periodic measuring signal oscillation. This periodic measuring signal oscillation can therefore be due to the fact that the flow itself has an oscillation. If the acceleration of the magnetic circuit device is a periodic vibration with a vibration amplitude and a vibration frequency and the measuring signal has a periodic measuring signal oscillation, then one embodiment of the method according to the invention is implemented by determining the measuring signal frequency of the periodic measuring signal oscillation and comparing the measuring signal frequency with the vibration frequency. A correction of the effect of the physical disturbance variable on the flow measurement is carried out when the measuring signal frequency corresponds to the vibration frequency of the magnetic circuit device or when the vibration frequency is included in the measuring signal oscillation.

If the measuring signal frequency coincides with the vibration frequency, then there is a very high probability that flow measurement will be affected by the vibration. The same applies when a portion with vibration frequency is found in the measuring signal of flow measurement. The medium itself then has a flow oscillation, but the flow is also disturbed by the vibrations. If the measuring signal has no portion with the vibration frequency of the magnetic circuit device, but only a flow vibration with a different frequency, then the flow measurement is not disturbed or influenced by the vibrations. The flow itself has a vibration, but need not be corrected.

The statements made in connection with the electromagnetic flowmeter are also applicable to the method and vice versa.

In detail, there are now various possibilities for designing and further developing the magnetic-inductive flowmeter according to the invention and the method according to the invention for operating a magnetic-inductive flowmeter as will be apparent from the description of preferred embodiments in conjunction with the accompanying drawings.

DETAILED DESCRIPTION OF THE INVENTION

Figure 1:
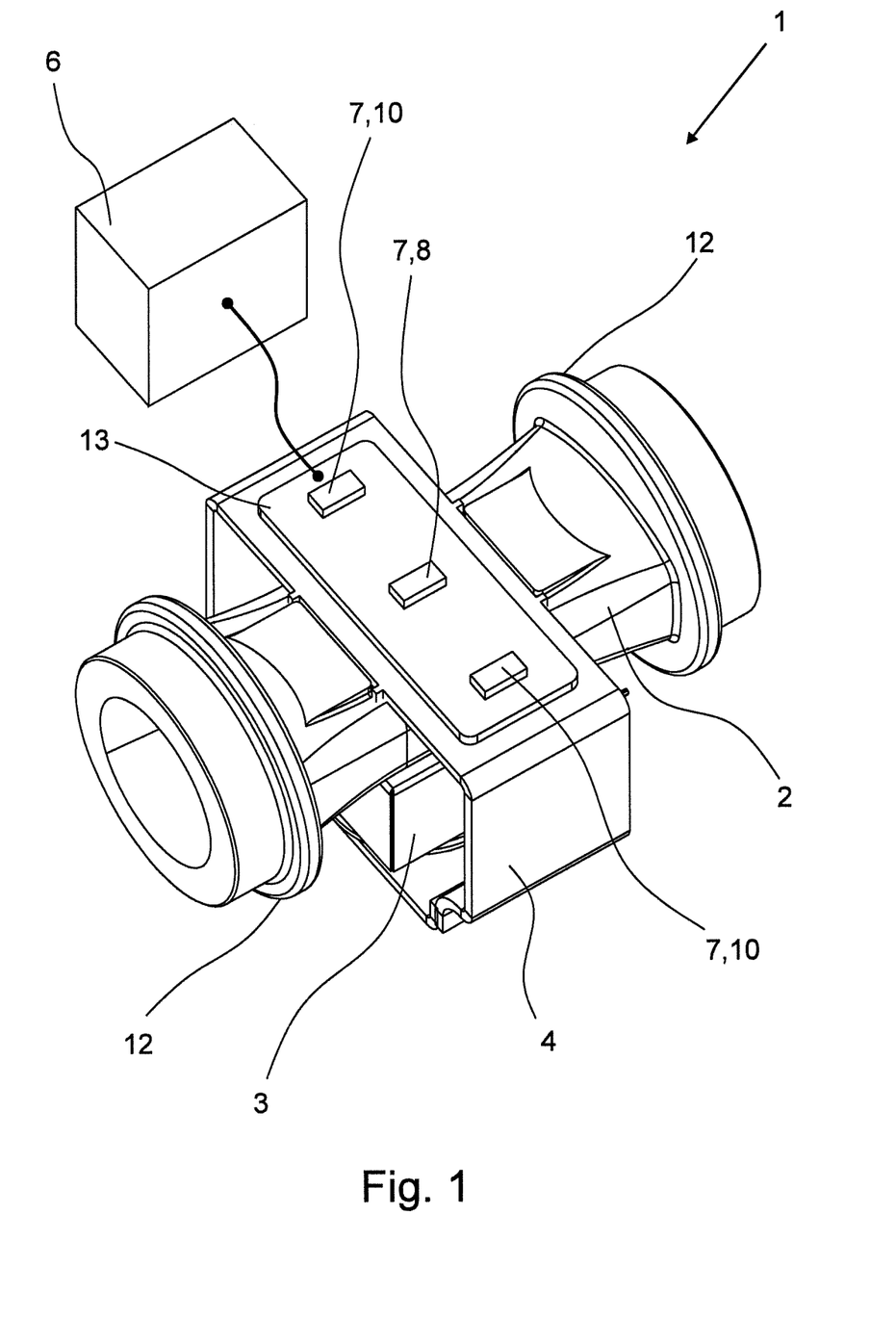
FIG. 1 is a perspective view of a magnetic-inductive flowmeter according to a first embodiment.

FIG. 1 shows a magnetic-inductive flowmeter 1 used to measure the flow of a conductive medium flowing through a measuring tube 2. A magnetic field generator 3 generates a measuring magnetic field which passes through the measuring tube 2. The measuring magnetic field is guided outside of the measuring tube 2 by means of a magnetic circuit device 4 and concentrated on the region of the measuring tube 2.

The measuring magnetic field causes a charge separation in the conductive medium flowing through the measuring tube 2. The charge separation in the medium in turn leads to a measurement voltage being induced in the medium, which is tapped with the aid of the electrodes 5 shown in FIG. 2 The measuring voltage is proportional to the speed with which the medium flows through the measuring tube 2. With the help of the speed and the diameter of the measuring tube 2, the flow of the medium can be determined.

An electronic control and evaluation unit 6 is used to control the magnetic-inductive flowmeter and to evaluate flow measurement. The measuring voltage is not only proportional to the speed of flow of the medium, but is also proportional to the measuring magnetic field. Accordingly, it is important that a measuring magnetic field is generated in the measuring tube 2 with high repeatability in order to be able to accurately determine the flow sustainably.

However, the measuring magnetic field can be influenced. In particular, indirect influences on the measuring magnetic field are not negligible. These indirect influences are influences that influence the properties of the magnetic circuit device 4. If the properties of the magnetic circuit device 4 change, then this results in a changed measuring magnetic field, whereby flow measurement is disturbed and distorted. Such an influence is, for example, the temperature of the magnetic circuit device 4. The magnetic circuit device 4 is made of a—preferably magnetically soft—material with a certain permeability. The permeability is a temperature-dependent variable, so it changes with the temperature. A changed permeability then results in a changed measuring magnetic field.

Another influence can be seen in an external magnetic field acting on the magnetic circuit device 4. Due to the external magnetic field, saturation of the magnetic circuit device 4, or at least alignment of the magnetic moments in the magnetic circuit device 4 in the direction of the external magnetic field may occur, whereby the magnetic field direction and thus the measuring magnetic field are likewise influenced.

Accelerations of the magnetic circuit device 4 also have an influence. Such accelerations are, in particular, due to vibrations of the magnetic circuit device 4, which may for example come from a pump connected to the electromagnetic flowmeter 1 or other component of the magnetic-inductive flowmeter 1. These physical disturbance variables—in particular the temperature of the magnetic circuit device 4, an external magnetic field acting on the magnetic circuit device 4 and an acceleration of the magnetic circuit device 4—thus influence the measuring magnetic field.

In order to detect the physical disturbance variables, sensors 7 are arranged on the magnetic circuit device 4. Three sensors 7 are arranged on the magnetic circuit device 4 shown in FIG. 1. The sensors 7 are arranged on the outer side of the magnetic circuit device 4, so they are arranged on the side that faces away from the measuring tube 2 and outside of the magnetic circuit. A first sensor 7 is designed as a temperature sensor 8 and is used to detect the temperature of the magnetic circuit device 4. Magnetic field sensors 9—shown, for example, in FIG. 3—or magnetic field switches 10 can be used for detecting the external magnetic field acting on the magnetic circuit device 4. The two other sensors shown in FIG. 1 are designed as magnetic field switches 10. The two magnetic field switches 10 are each sensitive to another component—a component of the external magnetic field along another spatial direction. Thus, a total of two components of the external magnetic field, i.e., the components of the external magnetic field, can be detected along two different spatial directions with the two magnetic field sensors 10.

Figure 2:
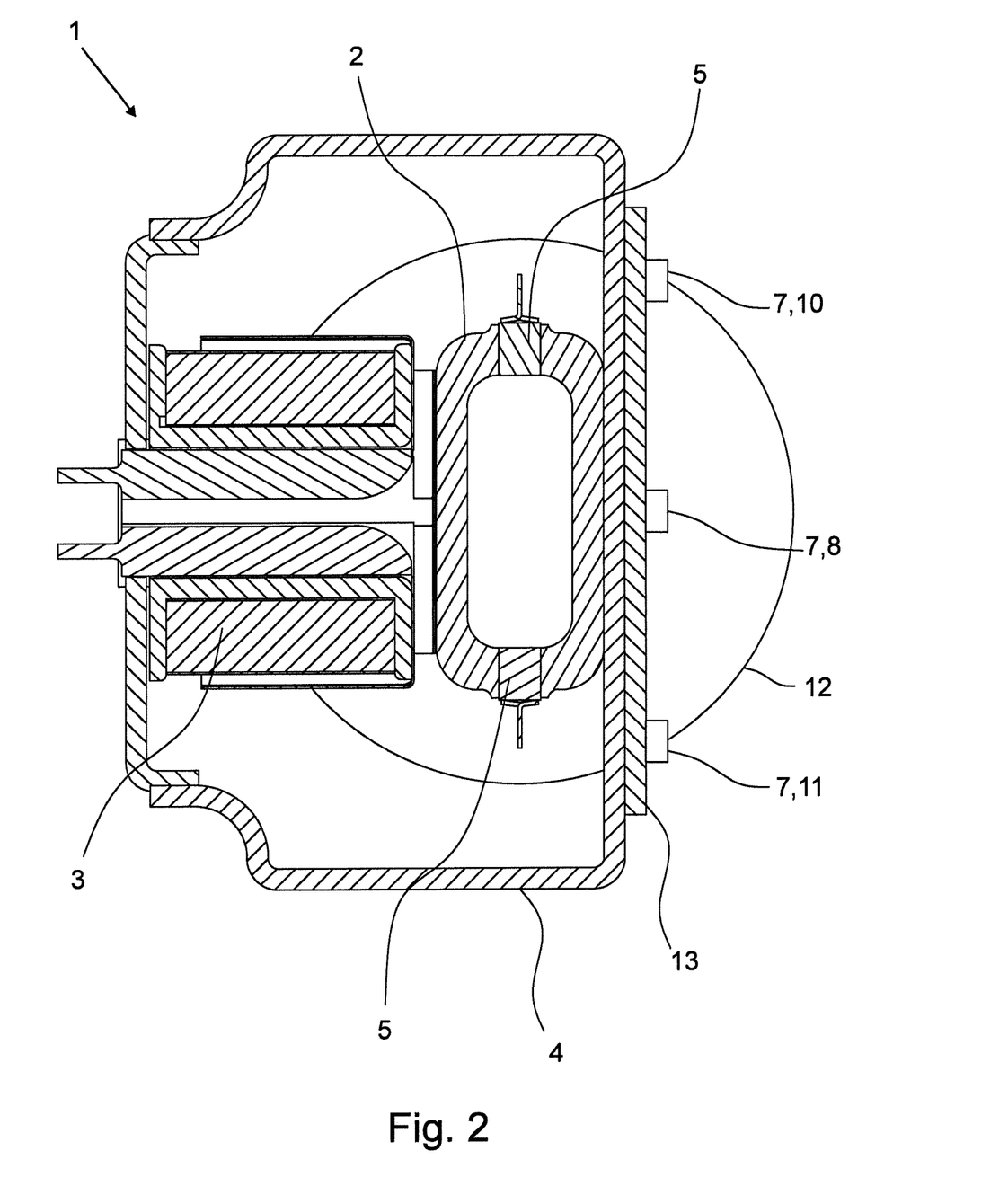
FIG. 2 is a cross-sectional view of the magnetic-inductive flowmeter shown in FIG. 1

FIG. 2 shows a cross-section of a magnetic-inductive flowmeter 1 corresponding essentially to the magnetic-inductive flowmeter 1 shown in FIG. 1. The flowmeter 1 shown in FIG. 2 differs from that shown in FIG. 1 merely by the type the sensors 7 that are arranged on the magnetic circuit device 4. The sensors 7 are in fact configured once as a temperature sensor 8, once as a magnetic field switch 10 and once as an acceleration sensor 11. The acceleration sensor 11 is for detecting a vibration of the magnetic circuit device 4, wherein the vibration frequency and the vibration amplitude are detected. The measuring tube 2 is flattened in the region of the electrodes 5 and has a substantially rectangular cross-section, wherein the electrodes 5 are arranged on the narrow side. The measuring tube 2 has a flange 12 at each of its two ends, with which the measuring tube 2 can be installed in a measuring section.

Both in FIG. 1 and in FIG. 2, the sensors 7 are attached to the magnetic circuit device 4 by means of a sensor fastening element 13, namely a printed circuit board 14. The control and evaluation unit 6 is connected to the sensors 7 via conductor paths, not shown, of the printed circuit board 14. The control and evaluation unit 6 is designed such that it detects an exceeding or falling below of a predetermined limit value of the physical disturbance variable—the temperature and/or the external magnetic field and/or vibration—and signals and/or carries out a correction of the effect of the physical disturbance variable on the flow measurement.

Figure 3:
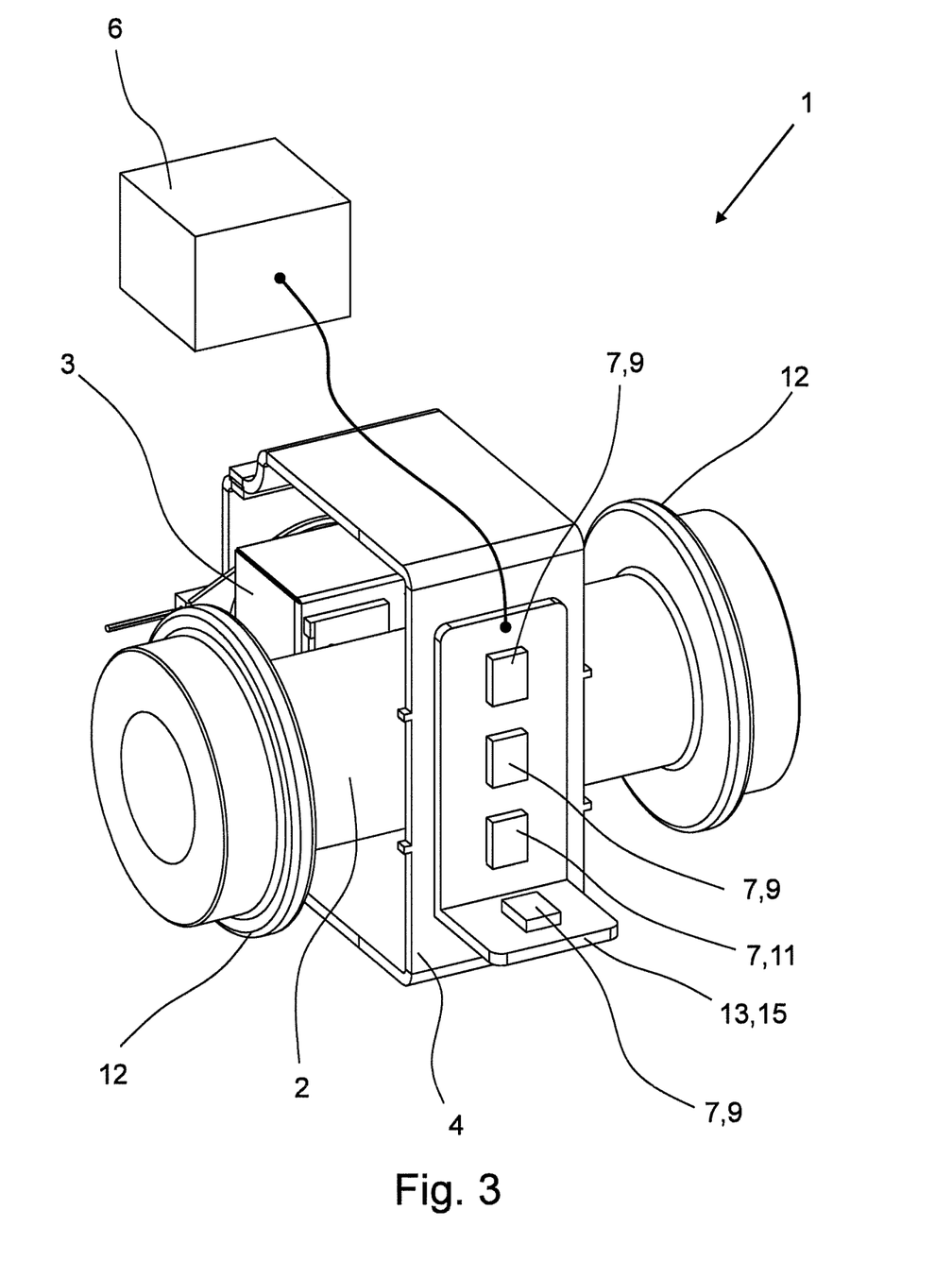
FIG. 3 is a perspective view of a magnetic-inductive flowmeter according to a second embodiment.

FIG. 3 shows a further embodiment of the magnetic-inductive flowmeter 1. The flowmeter 1 has a measuring tube 2 with a round cross section. Unlike in FIGS. 1 and 2, the sensor attachment element 13 is formed as an angle 15. Four sensors 7 are arranged on the angle 15. The design of the sensor attachment element 13 as an angle 15 makes it possible to arrange three magnetic field sensors 9 such that all three components of an external magnetic field can be detected, namely the components along each of the three spatial directions. Each of the three magnetic field sensors 9 are therefore sensitive to one component of the external magnetic field. In addition, an acceleration sensor 11 is arranged on the angle 15.

Figure 4:
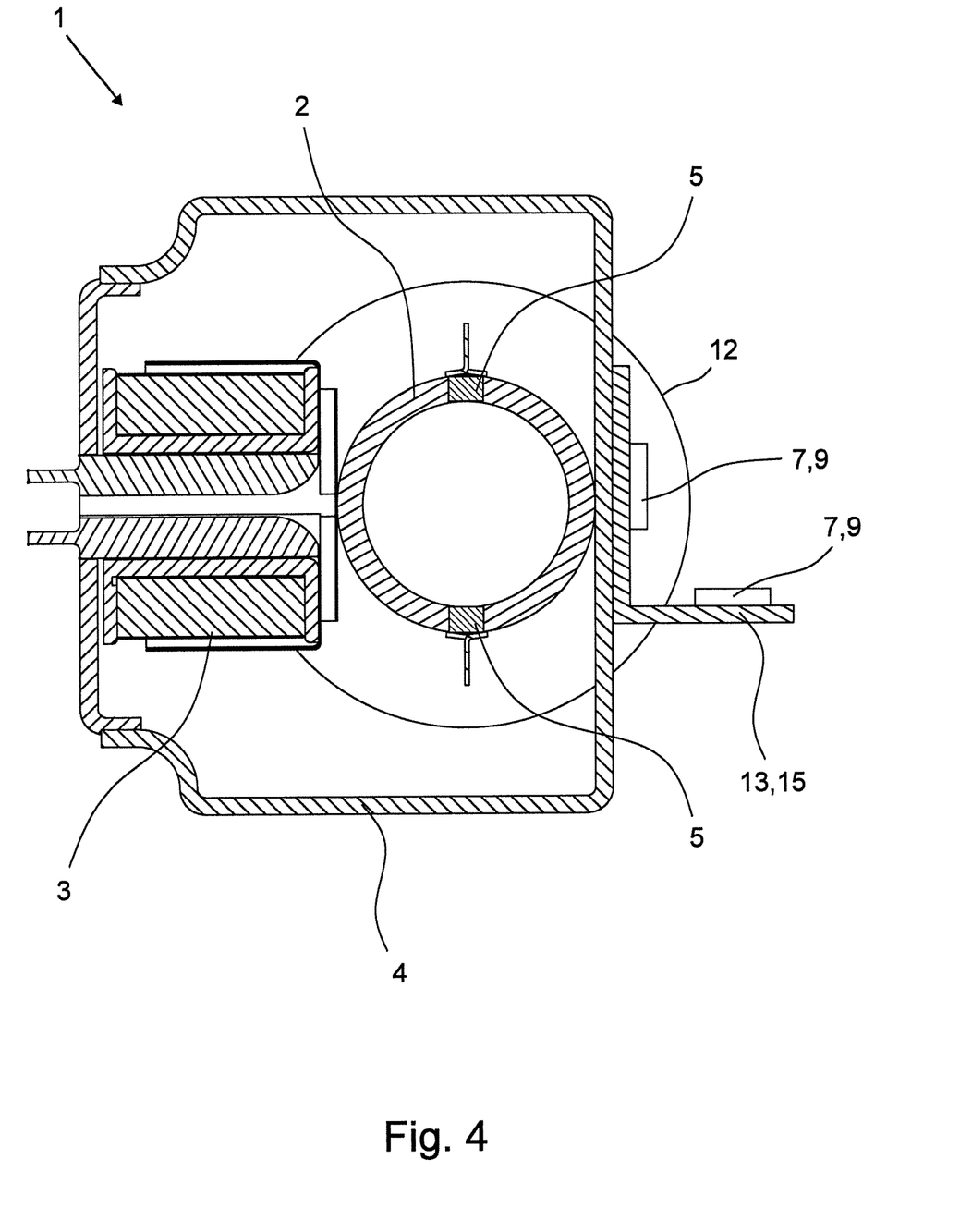
FIG. 4 is a cross-sectional view of a magnetic-inductive flowmeter according to a third embodiment.

FIG. 4, in turn, shows a cross-section of a magnetic-inductive flowmeter 1. The measuring tube 2 has a round cross-section, just as in FIG. 3. The sensor attachment element 13 is likewise designed as an angle 15. Overall, the flowmeter 1 has two sensors 7, namely two magnetic field sensors 9.

Figure 5:
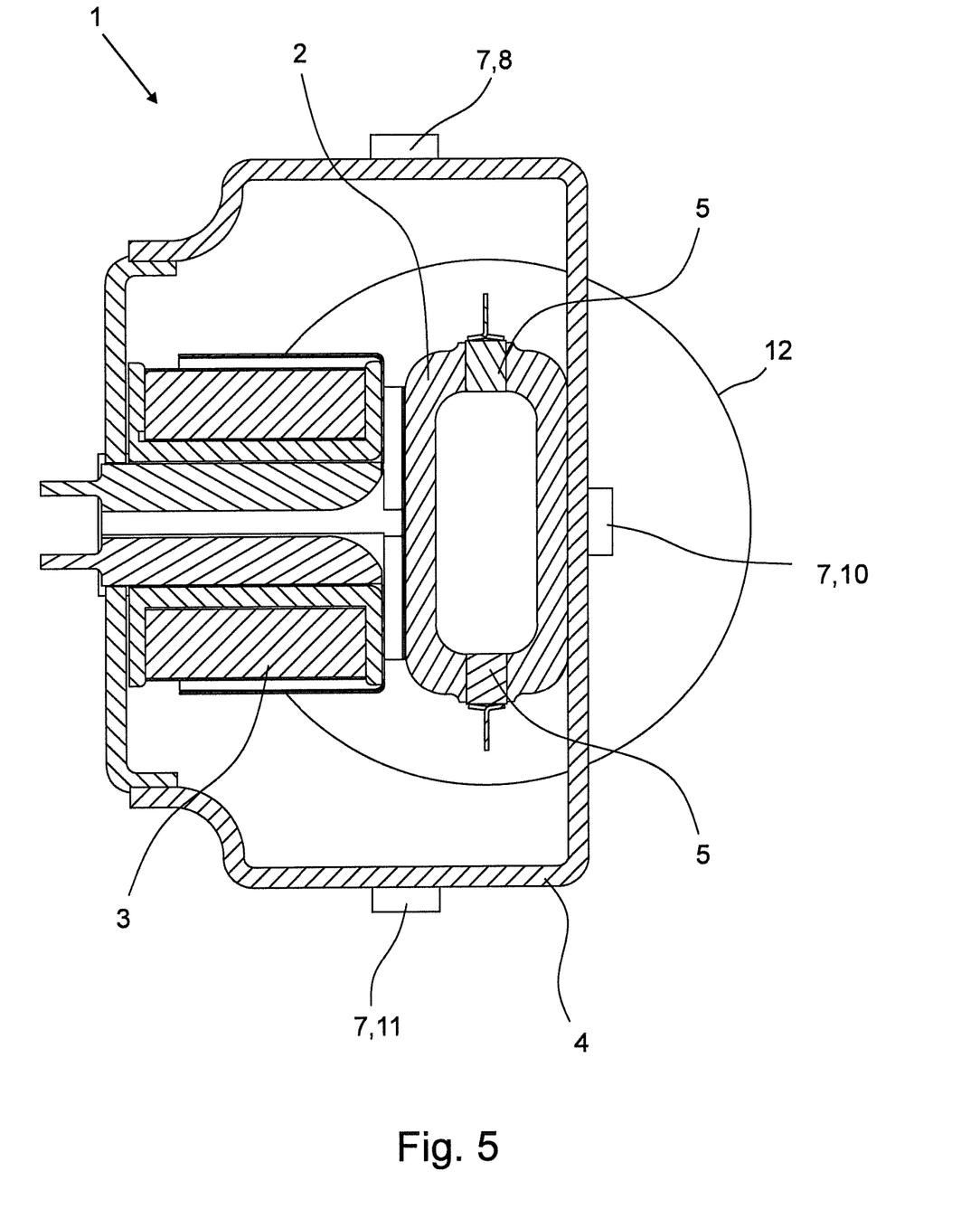
FIG. 5 is a cross-sectional view of a magnetic-inductive flowmeter according to a fourth embodiment.

FIG. 5 shows a further embodiment of a magnetic-inductive flowmeter 1. In contrast to the embodiments shown so far, in the flowmeter 1 shown in FIG. 5, the sensors 7 are attached directly to the magnetic circuit device, i.e., not attached by means of a sensor attachment element 13.

Figure 6:
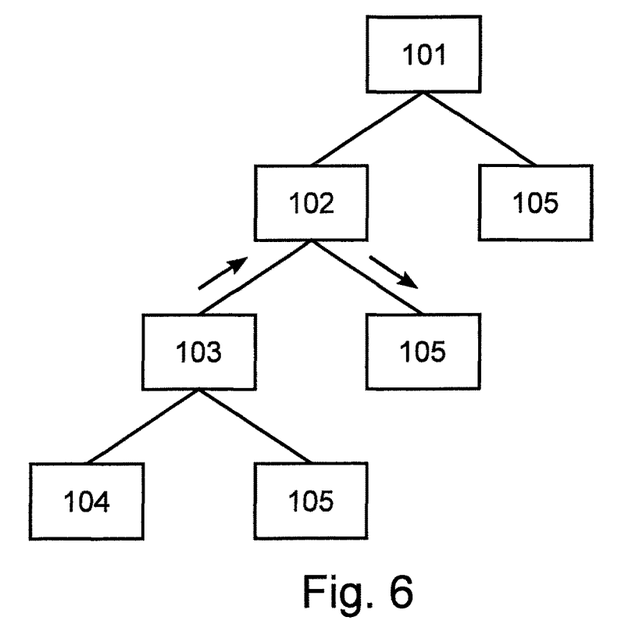
FIG. 6 is a block diagram of a first method for operating a magnetic-inductive flowmeter.

FIG. 6 shows a block diagram of a method for operating a described magnetic-inductive flowmeter 1. In a first step 101, the physical disturbance variable that acts on the magnetic circuit device 4 is first detected with the sensor 7. After the physical disturbance variable has been detected, various procedures can be performed, all of which are illustrated in FIG. 6:

After the physical disturbance variable is detected 101, it is compared 102 in a procedure with a limit value stored in the control and evaluation unit 6. The limit value may be an upper limit or a lower limit. Furthermore, both an upper and a lower limit can be stored. If the detected physical disturbance variable exceeds the upper limit or falls below the lower limit—represented by the upwardly pointing arrow in FIG. 6—, an error state is signaled 103. If the error state is signaled 103, flow measurement is either terminated 104 or a correction of the effect of the physical disturbance variable on the flow measurement 105 is carried out.

If no error state is signaled after the comparison of the physical disturbance variable with the predetermined limit value 102, the physical disturbance variable thus does not exceed an upper limit value or does not fall below a lower limit value, which is shown by the downwardly pointing arrow in FIG. 6, then a correction of the effect of the physical disturbance variable on the flow measurement 105 is carried out.

Another procedure provides that immediately after the detection of the physical disturbance variable 101, a correction of the effect of the physical disturbance variable on the flow measurement 105 is carried out. No comparison with a limit value 102 is stipulated.

Figure 7:
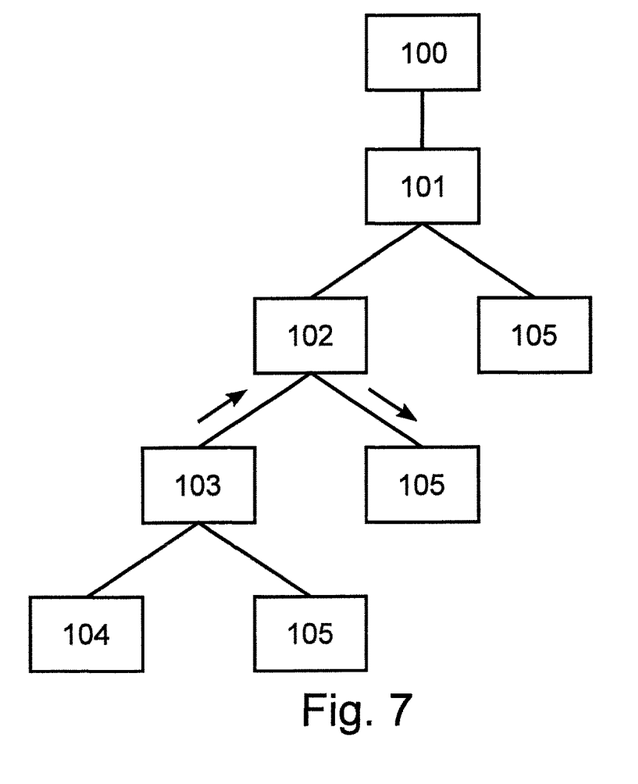
FIG. 7 is a block diagram of a second method for operating a magnetic-inductive flowmeter.

FIG. 7 shows a block diagram of a method for operating a magnetic-inductive flowmeter 1 of the type described, which essentially corresponds to the method described in FIG. 1, but with a further method step 100 preceding it. In order to be able to perform a correction of the effects of the physical disturbance variable on flow measurement, correction data for correcting the magnetic-inductive flow measurement is stored in the control and evaluation unit 6 in a method step 100. In this case, this correction data describes the dependence of the measurement voltage on the physical variable acting on the magnetic circuit device 4. If the physical disturbance variable is thus the temperature of the magnetic circuit device 4, i.e., the sensor 7 is designed as a temperature sensor 9, then the correction data describes the dependence of the measurement voltage on the temperature of the magnetic circuit direction 4. However, if the physical disturbance variable is an external magnetic field acting on the magnetic circuit device 4 and if the sensor 7, which is designed as a magnetic field sensor 9 or as a magnetic switch 10, detects the external magnetic field, then the correction data describes the dependence of the measuring voltage on the magnetic field acting on the outer magnetic field device 4. The correction of the effects of the physical disturbance variable is implemented by correcting the detected electrical measuring voltage when conductive medium is flowing through the measuring tube with the correction data stored in the control and evaluation unit 6.

Figure 8:
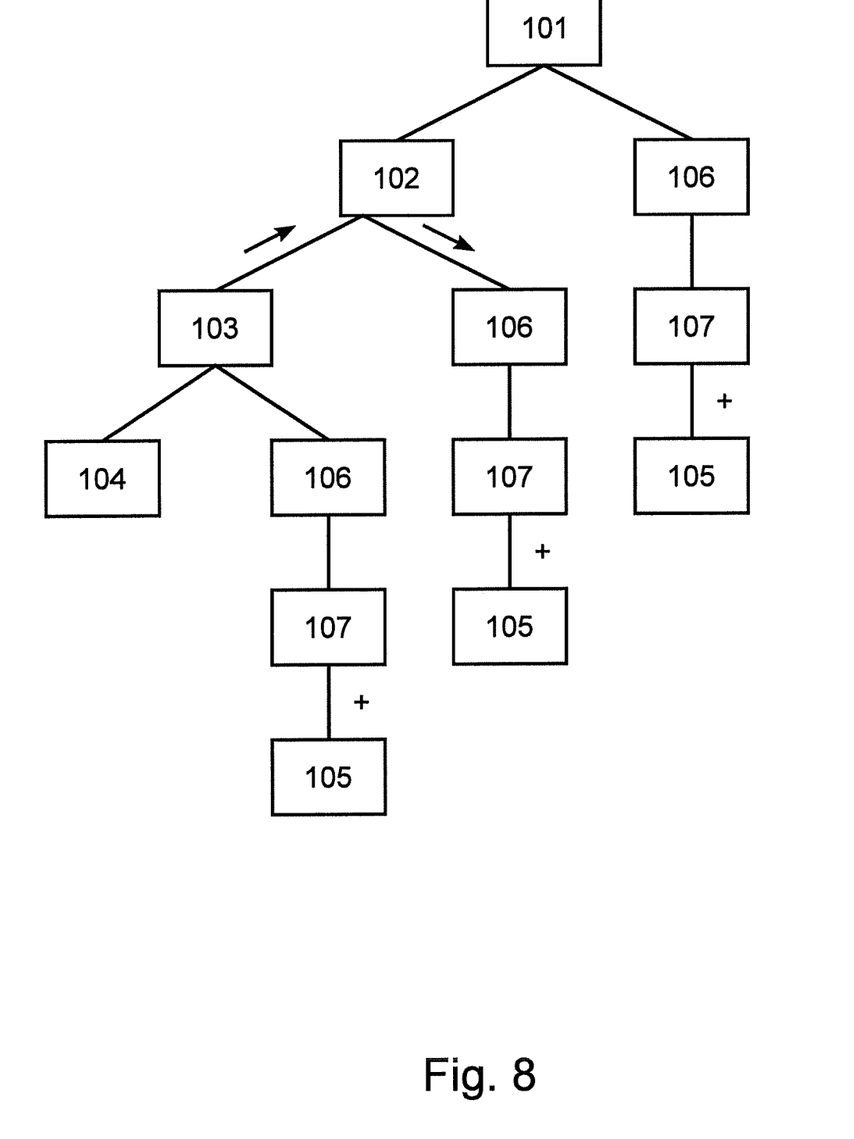
FIG. 8 is a block diagram of a third method for operating a magnetic-inductive flowmeter.

FIG. 8 shows another block diagram of a method for operating the magnetic-inductive flowmeter 1. The method of FIG. 8 is carried out when the physical disturbance variable is an acceleration of the magnetic circuit device 4, wherein the acceleration is a periodic vibration having a vibration amplitude and a vibration frequency and wherein the measurement signal comprises a periodic measurement signal oscillation. Before a correction of the effect of the physical disturbance variable on the flow measurement is carried out 105, the measurement signal frequency of the periodic measurement signal oscillation is determined in an upstream method step 106. In method step 107, the measuring signal frequency is then compared with the vibration frequency of the periodic vibration of the magnetic circuit device 4. A correction 105 of the effects of the periodic vibration on flow measurement is carried out when the measuring signal frequency corresponds to the vibration frequency of the magnetic circuit device or when the vibration frequency is included in the measuring signal oscillation—indicated by the plus sign in FIG. 8.

What is claimed is:

1. A magnetic-inductive flowmeter for measuring the flow of a conductive medium, comprising:
   a measuring tube,
   a magnetic field generator for generating a measuring magnetic field passing through the measuring tube,
   a magnetic circuit device for guiding the measuring magnetic field outside of the measuring tube,
   electrodes for detecting a flow-dependent electrical measuring voltage when the conductive medium flows through the measuring tube,
   an electronic control and evaluation unit, and
   a sensor arranged on the magnetic circuit device for detecting a physical disturbance variable acting on the magnetic circuit device so as to influence the measuring magnetic field,
   wherein the control and evaluation unit is adapted for at least one of detecting a signal exceeding or falling below a pre-definable limit value of the physical disturbance variable, or performing a correction of the influence of the physical disturbance variable on the flow measurement.

2. The magnetic-inductive flowmeter according to claim 1, wherein the sensor is a temperature sensor for detecting the temperature of the magnetic circuit device.

3. The magnetic-inductive flowmeter according to claim 1, wherein the sensor is a magnetic field sensor for detecting an external magnetic field acting on the magnetic circuit device.

4. The magnetic-inductive flowmeter according to claim 1, wherein the sensor is a magnetic switch for detecting an external magnetic field acting on the magnetic circuit device.

5. The magnetic-inductive flowmeter according to claim 1, wherein the sensor is an acceleration sensor for detecting acceleration of the magnetic circuit device.

6. The magnetic-inductive flowmeter according to claim 1, wherein at least one additional sensor is arranged on the magnetic, wherein the additional sensor is a sensor selected from the group consisting of a temperature sensor, as a magnetic field sensor, as a magnetic switch, or an acceleration sensor.

7. The magnetic-inductive flowmeter according to claim 6, wherein at least three sensors are arranged on the magnetic circuit device, wherein one sensor is a temperature sensor, another sensor is an acceleration sensor and the additional sensor is a magnetic field sensor or magnetic field switch.

8. The magnetic-inductive flowmeter according to claim 1, wherein the sensor is attached to the magnetic circuit device by means of a sensor attachment element.

9. The magnetic-inductive flow meter according to claim 8, wherein the sensor attachment element is a printed circuit board.

10. Magnetic-inductive flowmeter according to claim 8, wherein the sensor attachment element is configured as an angle.

11. A method for operating a magnetic-inductive flowmeter with a measuring tube, a magnetic field generator for generating a measuring magnetic field passing through the measuring tube, a magnetic circuit device for guiding the measuring magnetic field outside the measuring tube, electrodes for detecting a flow-dependent electrical measuring voltage when the conductive medium flows through the measuring tube, an electronic control and evaluation unit, an a sensor arranged on the magnetic circuit device for detecting a physical disturbance variable acting on the magnetic circuit device, the method comprising:
   detecting a physical disturbance variable acting on the magnetic circuit device by the sensor,
   comparing the physical disturbance variable with a predetermined limit value and
   at least one of signaling the occurrence of an error state when the predetermined limit value is exceeded or fallen below, or carrying out a correction of the effect of the physical disturbance variable on the flow measurement.

12. The method according to claim 11, wherein correction data for the correction of the magnetic-inductive flow measurement are stored in the control and evaluation unit,
   wherein, when the sensor is a temperature sensor, the correction data describe the dependence of the measuring voltage on the temperature of the magnetic circuit device caused by the temperature dependence of the measuring magnetic field, and wherein, when the sensor is a magnetic field sensor, the correction data describe the dependence of the measuring voltage on the external magnetic field acting on the magnetic field device caused by the dependence of the measuring magnetic field on the external magnetic field acting on the magnetic field device.

13. The method according to claim 12, wherein the sensor is a temperature sensor and wherein the temperature sensor detects the temperature of the magnetic circuit device, or wherein the sensor a magnetic field sensor and wherein the magnetic field sensor detects the external magnetic field at the magnetic circuit device, and wherein correction of the effect of the physical disturbance variable is implemented by the detected electrical measuring voltage being corrected with the correction data when a conductive medium flows through the measuring tube.

14. The method according to claim 11, wherein the sensor is an acceleration sensor and wherein the acceleration sensor detects acceleration of the magnetic circuit device due to vibrations of the magnetic circuit device, and wherein the correction of the effect of the physical disturbance variable on the flow measurement is implemented by selecting the measuring frequency for detecting the electrical measuring voltage such that the sampling period corresponds to a multiple of the vibration period.

15. The method according to claim 14, wherein the acceleration of the magnetic circuit device is a periodic vibration with a vibration amplitude and a vibration frequency and wherein the measuring signal has a periodic measuring signal oscillation, wherein the measuring signal frequency of the periodic measuring signal oscillation is determined, wherein the measuring signal frequency is compared with the vibration frequency and wherein correction of the effect of the physical disturbance variable on the flow measurement is carried out when the measuring signal frequency corresponds to the vibration frequency of the magnetic circuit device or when the vibration frequency is included in the measuring signal oscillation.

* * * * *